United States Patent
Solhusvik et al.

(10) Patent No.: US 8,723,095 B2
(45) Date of Patent: May 13, 2014

(54) METHOD AND APPARATUS FOR AMBIENT LIGHT DETECTION INCLUDING PLURAL IMAGE PIXELS AND AT LEAST ONE DARK PIXEL

(75) Inventors: Johannes Solhusvik, Haslum (NO); Trygve Willassen, Oppegard (NO)

(73) Assignee: Aptina Imaging Corporation, George Town (KY)

( * ) Notice: Subject to any disclaimer, the term of this patent is extended or adjusted under 35 U.S.C. 154(b) by 292 days.

(21) Appl. No.: 13/398,804

(22) Filed: Feb. 16, 2012

(65) Prior Publication Data
US 2013/0214125 A1 Aug. 22, 2013

(51) Int. Cl.
*H01L 27/00* (2006.01)

(52) U.S. Cl.
USPC .................................. 250/208.1; 250/214 AL

(58) Field of Classification Search
USPC ......... 250/208.1, 205, 214 AL, 214 R, 214.1; 396/98, 111; 348/294–311; 345/690–695, 207; 257/290, 291, 440
See application file for complete search history.

(56) References Cited

U.S. PATENT DOCUMENTS

| | | | |
|---|---|---|---|
| 7,683,305 B2 * | 3/2010 | Solhusvik et al. | 250/208.1 |
| 8,138,463 B2 | 3/2012 | Brown et al. | |

* cited by examiner

*Primary Examiner* — Que T Le

(57) ABSTRACT

Electronic devices may be provided with image sensors. Image sensors may be configured to capture images during imaging operations and monitor ambient light levels during non-imaging operations. An image sensor may include image pixels that receive light and dark pixels that are prevented from receiving light. An image sensor may include an ambient light detection circuit. The ambient light detection circuit may include an oscillator, timing and control circuitry, and a counter. The oscillator may be switchably coupled to the image pixels and the dark pixels. The counter may be configured to count up oscillator cycles of the oscillator while the oscillator is coupled to the image pixels and to count down oscillator cycles of the oscillator while the oscillator is coupled to the dark pixels. The counter may provide a count value that depends on a signal from the image pixels and a signal from the dark pixels.

20 Claims, 9 Drawing Sheets

METHOD AND APPARATUS FOR AMBIENT LIGHT DETECTION INCLUDING PLURAL IMAGE PIXELS AND AT LEAST ONE DARK PIXEL

BACKGROUND

This relates generally to imaging devices, and more particularly, to imaging devices with ambient light sensing capabilities.

Image sensors are commonly used in electronic devices such as cellular telephones, cameras, and computers to capture images. In some situations, electronic devices are provided with ambient light sensors for sensing the amount of ambient light in the environment surrounding the device. Ambient light information from an ambient light sensor may be used by a device, for example, to determine the appropriate level of illumination for a display or a camera flash. In some situations, an ambient light sensor may operate when an electronic device enters a low-power energy-saving mode.

Electronic devices are sometimes provided with image sensors for capturing incoming light and additional, separate ambient light sensors. However, stand-alone ambient light sensors may use an undesirable amount of additional power and often require additional volume within the device to accommodate the stand-alone ambient light sensor.

It would therefore be desirable to be able to provide improved imaging systems with ambient light sensing capabilities.

DETAILED DESCRIPTION

Digital camera modules are widely used in electronic devices such as digital cameras, computers, cellular telephones, and other electronic devices. These electronic devices may include image sensors that gather incoming light to capture an image. The image sensors may include arrays of image pixels. The pixels in the image sensors may include photosensitive elements such as photodiodes that convert the incoming light into electric charges. Image sensors may have any number of pixels (e.g., hundreds or thousands or more). A typical image sensor may, for example, have hundreds, thousands, or millions of pixels (e.g., megapixels). Arrays of image pixels may be coupled to power supply circuitry that is configured to provide a power supply voltage to the image pixels. An image sensor may include ambient light detection circuitry coupled to the image pixels that is configured to detect changes in pixel voltages due to ambient light that is incident on the image pixels.

Figure 1:
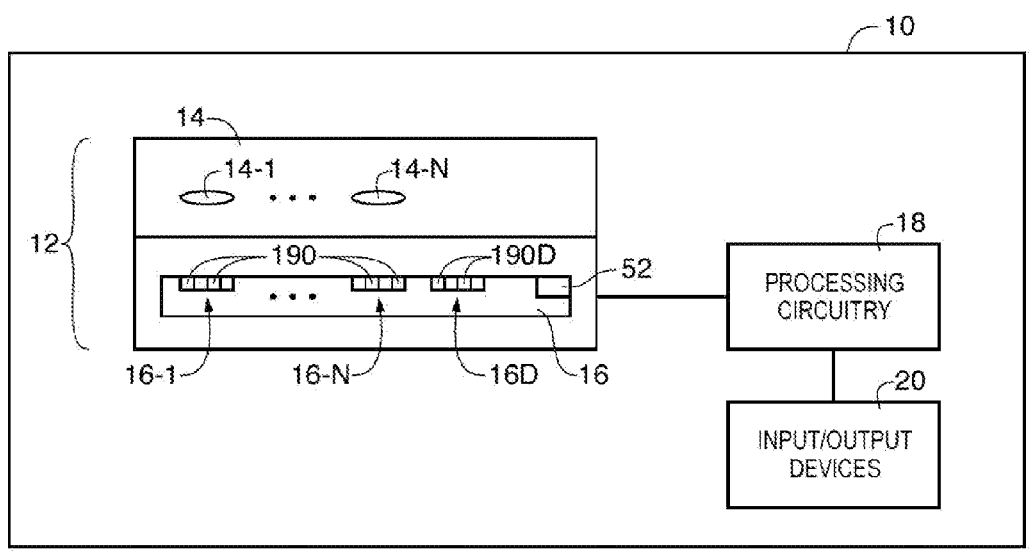
FIG. 1 is a diagram of an illustrative electronic device that contains a camera module with an array of lenses, an array of corresponding image sensors and ambient light sensor circuitry in accordance with an embodiment of the present invention.

FIG. 1 is a diagram of an illustrative electronic device that uses an image sensor to capture images and to detect ambient light. Electronic device 10 of FIG. 1 may be a portable electronic device such as a camera, a cellular telephone, a video camera, a computer, or other electronic device that captures digital image data. Camera module 12 may be used to convert incoming light into digital image data. Camera module 12 may include an array of lenses 14 and a corresponding array of image sensors 16. During image capture operations, light from a scene may be focused onto image pixels 190 of image sensors 16-1, . . . 16-N using respective lenses 14-1, . . . 14-N. Lenses 14 and image sensors 16 may be mounted in a common package and may provide image data to processing circuitry 18.

During ambient light sensing operations, ambient light from a scene may be focused onto one or more of image sensors 16-1, . . . 16-N using respective lenses 14-1, . . . 14-N. A current generated in one or more of image sensors 16-1, . . . 16-N may be detected using circuitry such as ambient light detection circuitry 52 on image sensor array 16. Ambient light data (e.g., digital data containing information regarding detected changes in ambient light conditions or absolute ambient light conditions) may be provided to processing circuitry 18.

Processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18. Processed image data may, if desired, be provided to external equipment (e.g., a computer or other device) using wired and/or wireless communications paths coupled to processing circuitry 18.

Processing circuitry 18 may be configured to generate a response to ambient light data received from circuitry 52 of image sensor array 16. For example, processing circuitry 18 may be configured to reduce the intensity of light generated by a backlight associated with a display when ambient light decreases in the vicinity of an electronic device (e.g., due to a light being switched off in the room in which the electronic device is located). As another example, processing circuitry 18 may be configured to wake electronic device from a low-power energy-saving mode (e.g., a hibernation mode) when a change in the ambient light conditions due to motion in the vicinity of the electronic device (e.g., due to a user entering a room and sitting in front of a computer monitor) is detected. These examples are merely illustrative. Processing circuitry 18 may be configured to modify the operation of any electronic component associated with device 10 based on detected changes in ambient light conditions.

If desired, processing circuitry 18 may be configured to modify the operation of an electronic component based on changing ambient light conditions across sections of a pixel array. For example, increased (or decreased) ambient light levels detected in one section (or group) of image pixels at a first time and in a second section (or group) of pixels at a later time may indicate motion in the vicinity of device 10. If desired, processing circuitry 18 may be configured to "wake" electronic device 10 when motion is detected across sections of pixels in a pixel array (or across multiple pixel arrays).

There may be any suitable number of lenses 14 in lens array 14 and any suitable number of image sensors in image sensor array 16. Lenses 14 may be identical or may be different (e.g., some of lenses 14 may have different focal lengths, some may be convex, some may be concave, etc.). Lens array 14 may, as an example, include N*M individual lenses arranged in an N×M two-dimensional array.

The values of N and M may be equal to or greater than one, may be equal or greater than two, may be equal to or greater than three, may exceed 10, or may have any other suitable values. Image sensor array 16 may contain a corresponding N×M two-dimensional array of individual image sensors. The image sensors may be formed on one or more separate semiconductor substrates. With one suitable arrangement, which is sometimes described herein as an example, the image sensors are formed on a common semiconductor substrate (e.g., a common silicon image sensor integrated circuit die).

Each image sensor may be identical or there may be different types of image sensors in a given image sensor array integrated circuit. Each image sensor may be a Video Graphics Array (VGA) sensor with a resolution of 480×640 sensor pixels (as an example). Other types of sensor pixels may also be used for the image sensors if desired. For example, images sensors with greater than VGA resolution sensor (e.g., high-definition image sensors) or less than VGA resolution may be used, image sensor arrays in which the image sensors are not all identical may be used, etc.

If desired, some image sensors of image sensor array 16 such as image sensor 16D may be dark image sensors (i.e., image sensors having image pixels that are prevented from receiving incoming light). Dark image sensors such as dark image sensor 16D may include dark image pixels 190D that are prevented from receiving light such as incoming image light or incoming ambient light. Dark image pixels 190D may include circuitry that is substantially the same as circuitry in light image pixels 190. Dark pixels 190 may be coupled to readout circuitry that is substantially the same as readout circuitry coupled to light image pixels 190. In this way, dark currents generated in dark image pixels 190D (e.g., due to heat in the substrate) may be substantially the same as dark currents generated in light image pixels 190 and these dark currents may be removed from signals (e.g., image signals or ambient light signals) generated by light image pixels 190.

In the example of FIG. 1, dark pixels 190 are formed in a dark image sensor 16D that is formed on a common substrate with light image sensors 16-1, . . . 16-N and is separate from light image sensors 16-1, . . . 16-N. However, this is merely illustrative. If desired, one or more dark image sensors 16D may be formed on one or more separate substrates. If desired, dark image pixels 190D may form a portion of one of light image sensors 16-1, . . . 16-N (e.g., selected pixels 190 of a light image sensor such as a row of pixels, a column of pixels, a sub-array of pixels, or any other group of pixels may include a light block for preventing incoming light from reaching those selected pixels while other pixels 190 receive incoming light).

During imaging operations, dark currents from dark pixels 190D may be continuously removed (e.g., subtracted) from image signals from light image pixels 190. During ambient light sensing operations, light image pixels 190 and dark image pixels 190D may be alternately coupled to circuitry 52 so that dark current measured by dark pixels 190D may be removed from an ambient light signal detected by light image pixels 190.

The use of a camera module having ambient light sensing capabilities including alternate coupling of dark pixels such as dark pixels 190D to ambient light detection circuitry such as circuitry 52 may provide device 10 with the ability to detect a broad range of ambient light conditions (e.g., device 10 may be able to detect a large dynamic range due of ambient light conditions due to enhanced low light detection capabilities that are enhanced by the removal of dark current from ambient light signals). Providing device 10 with an image sensor capable of this type of wide dynamic range ambient light detection using low-power drawing circuitry may simplify manufacturing and reduce costs associated with including a stand-alone ambient light detection module.

If desired, device 10 may provide a user with numerous high-level functions. In a computer or advanced cellular telephone, for example, a user may be provided with the ability to run user applications. To implement these functions, device 10 may have input/output devices such as input/output devices 20 respectively. Input/output devices 20 may include devices such as keypads, input-output ports, joysticks, and displays coupled to processing circuitry 18. Processing circuitry 18 may include volatile and nonvolatile memory (e.g., random-access memory, flash memory, hard drives, solid state drives, etc.). Processing circuitry 18 may also include microprocessors, microcontrollers, digital signal processors, application specific integrated circuits, etc.

In some modes of operation, all of the sensors on array 16 may be active (e.g., when capturing high-quality images). In other modes of operation (e.g., a low-power preview mode, or ambient light detection mode), only a subset of the image sensors may be used. Other sensors may be inactivated to conserve power (e.g., their positive power supply voltage terminals may be taken to a ground voltage or other suitable power-down voltage and their control circuits may be inactivated or bypassed).

Figure 2:
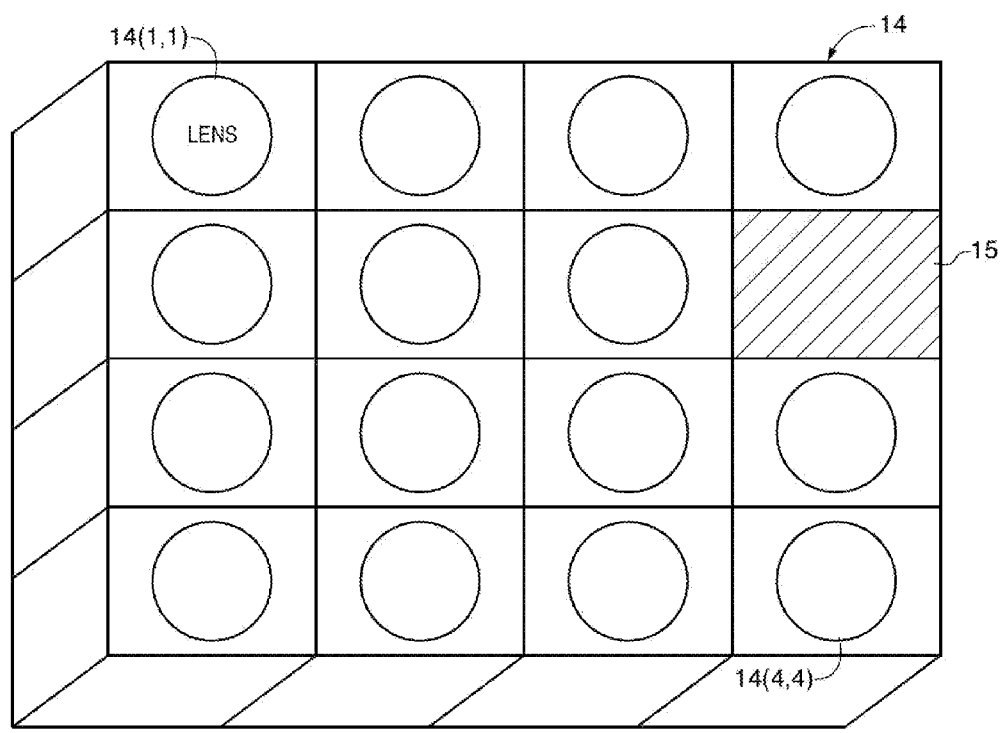
FIG. 2 is a perspective view of an illustrative camera module having an array of lenses in accordance with an embodiment of the present invention.

FIG. 2 is a perspective view of an illustrative camera module having an array 14 of lenses (e.g., lenses such as lenses 14(1,1), 14(4,1) and 14(4,4)). The array of lenses may, for example, be a rectangular array having rows and columns of lenses. The lenses may all be equally spaced from one another or may have different spacings. There may be any suitable number of lenses 14 in the array. If desired, some portions of lens array such as portion 15 may include light blocking structures. In the FIG. 2 example, there are four rows and four columns of lenses and one portion 15 having light blocking structures.

Figure 3:
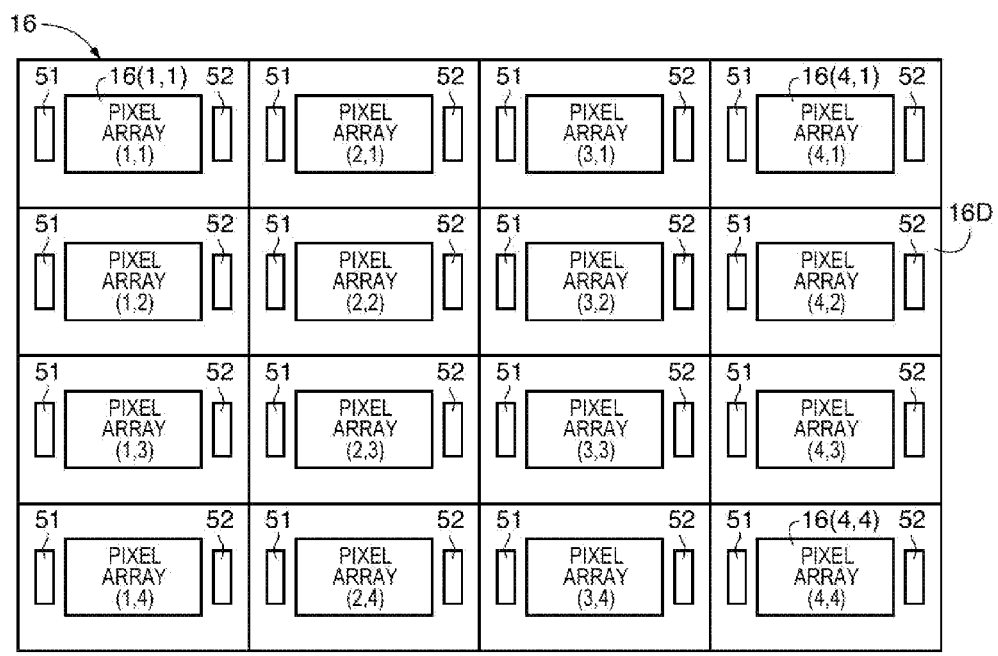
FIG. 3 is a diagram of an illustrative sensor array of the type that may be used with the lens array of FIG. 2 in a camera module in accordance with an embodiment of the present invention.

An illustrative sensor array of the type that may be used with the lens array of FIG. 2 is shown in FIG. 3. As shown in FIG. 3 sensor array 16 may include image sensors such as sensor 16(1,1), 16(4,1), and 16(4,4). The array of FIG. 3 has sixteen image sensors, but, in general, array 16 may have any suitable number of image sensors (e.g., on image sensor, two or more sensors, four or more sensors, ten or more sensors, 20 or more sensors, etc.). As shown in FIG. 3, one or more of image sensors 16 may include a dark image sensor such as dark image sensor 16D. Dark image sensor 16D may be prevented from receiving incoming light using light blocking structures such as portion 15 of lens array 14. Light blocking structures that prevent light from reaching dark image sensor 16D may be formed from plastic, metal, ceramic, composites, coatings or other suitable opaque materials. Light blocking structures may form a portion of lens array 14, may be formed directly on pixels of dark image sensor 16D, may form a portion of image sensor array 16, or may be otherwise configured to block light from reaching dark pixels 190 of dark image sensor 16D.

Images sensors of image sensor array 16 may, if desired, be provided with other circuitry such as control circuitry 51 for operating image sensors 16. Control circuitry 51 may include row-select and control driver circuitry that issues control signals such as reset signals, row select signals, etc. for controlling rows of pixels 190 and/or 190D. Control circuitry 51 may include column readout circuitry that receives analog image data signals from columns of image sensor pixels 190 and/or 190D using vertical data lines and sample-and-hold circuitry and, following digitization using analog-to-digital converter circuitry, provides corresponding digitized output signals processing circuitry 18.

In the example of FIG. 3, control circuitry 51 is located on a single side of each image sensor 16. However, this is merely illustrative. Control circuitry 51 may be formed anywhere on image sensor array 16. Ambient light detection circuitry 52 may be formed separately from control circuitry 51 or may form a portion of control circuitry 51.

Figure 4:
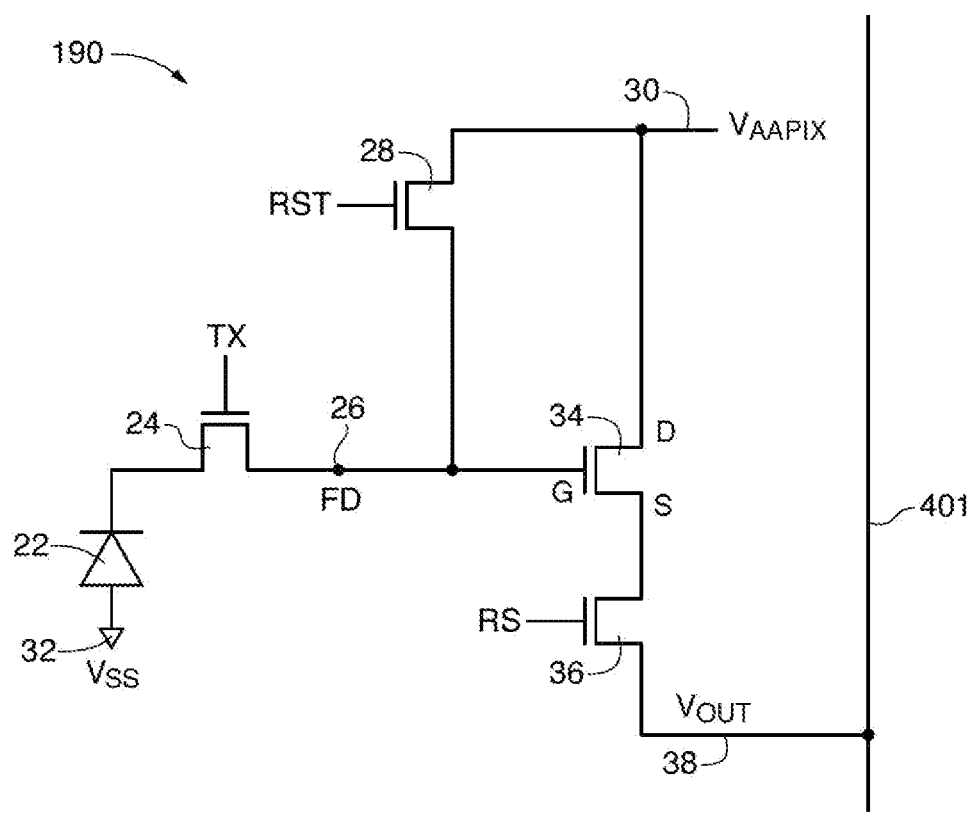
FIG. 4 is a diagram of an illustrative image sensor pixel in accordance with an embodiment of the present invention.

Circuitry in an illustrative pixel of one of the image sensors in sensor array 16 is shown in FIG. 4. As shown in FIG. 4, pixel 190 includes a photosensitive element such as photodiode 22. A positive power supply voltage (e.g., voltage Vaapix) may be supplied at positive power supply terminal 30. A ground power supply voltage (e.g., Vss) may be supplied at ground terminal 32. Incoming light may be collected by photodiode 22 after passing through a color filter structure. Photodiode 22 converts the light to electrical charge.

During imaging operations, before an image is acquired, reset control signal RST may be asserted. This turns on reset transistor 28 and resets charge storage node 26 (also referred to as floating diffusion FD) to Vaapix. The reset control signal RST may then be deasserted to turn off reset transistor 28. After the reset process is complete, transfer gate control signal TX may be asserted to turn on transfer transistor (transfer gate) 24. When transfer transistor 24 is turned on, charge that has been generated by photodiode 22 in response to incoming light is transferred to charge storage node 26.

Charge storage node 26 may be implemented using a region of doped semiconductor (e.g., a doped silicon region formed in a silicon substrate by ion implantation, impurity diffusion, or other doping techniques). The doped semiconductor region (i.e., the floating diffusion FD) exhibits a capacitance that can be used to store the charge that has been transferred from photodiode 22. The signal associated with the stored charge on node 26 is conveyed to row select transistor 36 by source-follower transistor 34.

When it is desired to read out the value of the stored charge (i.e., the value of the stored charge that is represented by the signal at the source S of transistor 34), row select control signal RS can be asserted. When signal RS is asserted, transistor 36 turns on and a corresponding signal $V_{OUT}$ that is representative of the magnitude of the charge on charge storage node 26 is produced on output path 38. In a typical configuration, there are numerous rows and columns of pixels such as pixel 190 in the image sensor pixel array of a given image sensor. A vertical conductive path such as path 401 can be associated with each column of pixels. When signal RS is asserted in a given row, path 401 can be used to route signal $V_{OUT}$ from that row to readout circuitry.

Dark pixels 190D may have substantially the same circuitry as pixels 190. Dark pixels 190D may be read out in the same way described above in connection with pixel 190 of FIG. 4. Dark pixels 190D may include photodiodes such as photodiodes 22 that are prevented from receiving incoming light (e.g., image light or ambient light). If desired, other types of image pixel circuitry may be used to implement the image pixels of sensors 16-1, . . . 16-N, and 16D. For example, each image sensor pixel may be a three-transistor pixel, a pin-photodiode pixel with four transistors, a global shutter pixel, a time-of-flight pixel, etc. The circuitry of FIG. 4 is merely illustrative.

In a typical configuration, there are numerous rows and columns of pixels such as pixel 190 in the image sensor pixel array of a given image sensor. Generally the power supply terminals 30 of pixels 190 in an image sensor pixels array are coupled to a common power supply network (e.g., metal power supply lines coupled to each terminal 30 so that a positive power supply voltage Vaapix applied to the power supply circuitry of the pixel array is supplied to all pixels 190).

During ambient light detection operations, a global RST and TX signal may be asserted in order to turn on reset transistors 28 and transfer transistors 24 of some or all pixels 190 and/or some or all of dark pixels 190D. While transfer transistors 24 and reset transistors 28 of pixels being used for ambient light detection or dark current subtraction are turned on, those pixels may be coupled to ambient light detection circuitry 52 for ambient light detection operations.

Ambient light that is incident on photodiodes 22 may generate charges that cause a change in the voltage that is coupled to terminals 30 of those pixels 190. Voltage changes generated by ambient light on photodiodes 22 may be coupled through terminals 30 to ambient light detection circuitry 52. The changing voltage on pixels 190 may cause a current to flow in the power supply network of a pixel array, thereby causing current to flow in the ambient light detection circuitry that can be detected by the ambient light detection circuitry.

Figure 5:
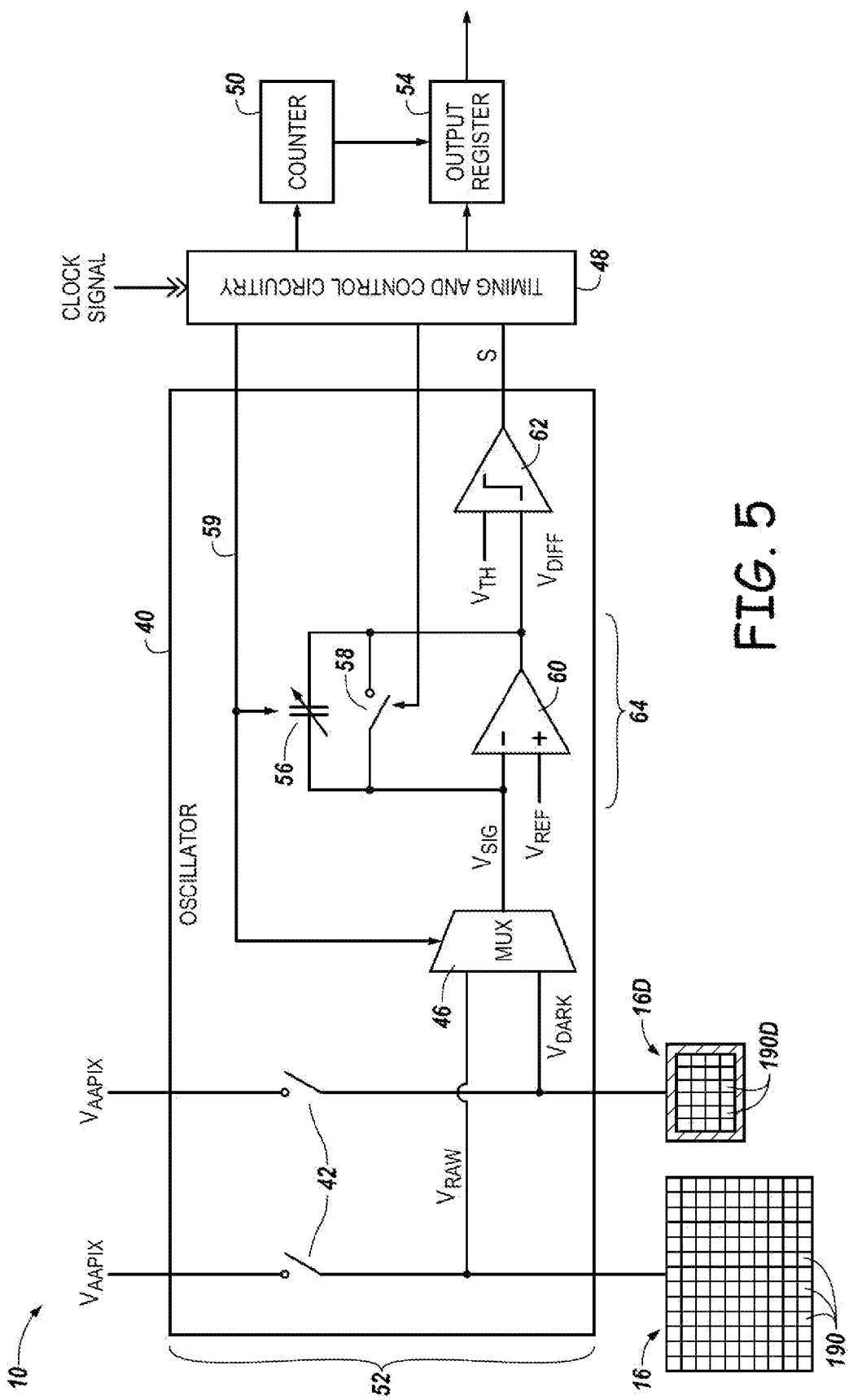
FIG. 5 is a diagram of an illustrative ambient light sensor circuit having integration circuitry in accordance with an embodiment of the present invention.

As shown in FIG. 5, ambient light detection circuitry 52 of device 10 may be coupled to one or more image sensors such as light image sensors 16 and dark image sensors 16D having image pixels 190 and dark image pixels 190D respectively. Circuitry 52 may include an oscillator circuit such as oscillator 40 having switches such as switches 42 for coupling light image pixels and dark image pixels to multiplexer 46. During ambient light detection operations, transfer transistors such as transistors 24 and reset transistors 28 of all pixels 190 may remain on so that photodiodes 22 of pixels 190 remain coupled to ambient light detection circuitry 52. During imaging operations, switches 42 may remain closed in order to provide voltage Vaapix to image sensor array 16. During ambient light detection operations, switches 42 may remain open in order to direct current from light image pixels 190 and dark image pixels 190D to multiplexer 46.

Ambient light detection circuitry 52 may include oscillator 40, timing and control circuitry 48, a counting circuit such as counter 50 and output circuitry such as output register 54. Oscillator 40 of ambient light detection circuitry 52 may include multiplexer 46 coupled to both light image pixels 190 and dark pixels 190D. Multiplexer 46 may be operable to alternately couple image pixels 190 and dark pixels 190D to additional components of ambient light detection circuitry 52. Multiplexer 46 may receive a switching signal from timing and control circuitry (as indicated by dashed line 59) that operates multiplexer 46 to alternately provide ambient light signal $V_{RAW}$ (from pixels 190) and dark signal $V_{DARK}$ from dark pixels 190D to ambient light detection circuitry 52. The switching signal from timing and control circuitry 48 may also operate a capacitor such as variable capacitor 56 to change the capacitance of capacitor 56 to compensate for any difference in the number of light pixels and the number of dark pixels 190D that are coupled to ambient light detection circuitry 52.

For example, a number NA of light pixels 190 may be coupled to ambient light detection circuitry 52 during some portions of an ambient light detection operation and a number ND of dark pixels 190D may be coupled to ambient light detection circuitry 52 during other portions of an ambient light detection operation. Because dark pixels 190D may be used to remove dark current from light signals from light pixels 190, the capacitance of capacitor 56 may be changed if the number of light pixels NA is different from the number of dark pixels ND. For example, during light gathering portions of an ambient light detection operation, capacitor 56 may have a capacitance C (e.g., 1 pF). During dark current subtraction portions of an ambient light detection operation, the capacitance of capacitor 56 may be changed to C2=C*(ND/NA). Variable capacitor 56 may, for example, be formed using an array of unit capacitors as is commonly used in analog-to-digital conversion circuitry.

Oscillator 40 may include differential amplifier 60 and switch 58 coupled in parallel with capacitor 56 between multiplexer 46 and comparator 62. Timing and control circuitry 48 may be configured to operate switch 58. Timing and control circuitry 48 may be configured to receive a clock signal from, for example, central processing circuitry of device 10. Differential amplifier 60 may be provided with the output signal voltage $V_{SIG}$ (e.g., $V_{RAW}$ or $V_{DARK}$) from multiplexer 46 and a reference voltage $V_{REF}$. A differential signal $V_{DIFF}$ (e.g., the difference between $V_{SIG}$ and $V_{REF}$) may be provided from differential amplifier 60 to comparator 62. Comparator 62 may be provided with a threshold signal $V_{TH}$. Comparator 62 may be configured to send a saturation signal S to timing and control circuitry 48 each time signal $V_{DIFF}$ becomes substantially equal to threshold voltage $V_{H}$. Comparator 62 may be a low-power comparator that is biased with a relatively low current so that vary little power is consumed during ambient light detection operations compared with the power that is consumed during imaging operations. In this way, ambient light detection operations may exert a minimal drain on a battery or other power supply for device 10.

Upon receiving signal S from oscillator 40, timing and control circuitry 48 may be configured to temporarily close switch 58 and send a count signal to counter 50. In this way, integration circuit 64 of oscillator 40 may be reset and counter 50 may accumulate a count corresponding to the amount of current generated by ambient light that is incident on image pixels 190.

Figure 6:
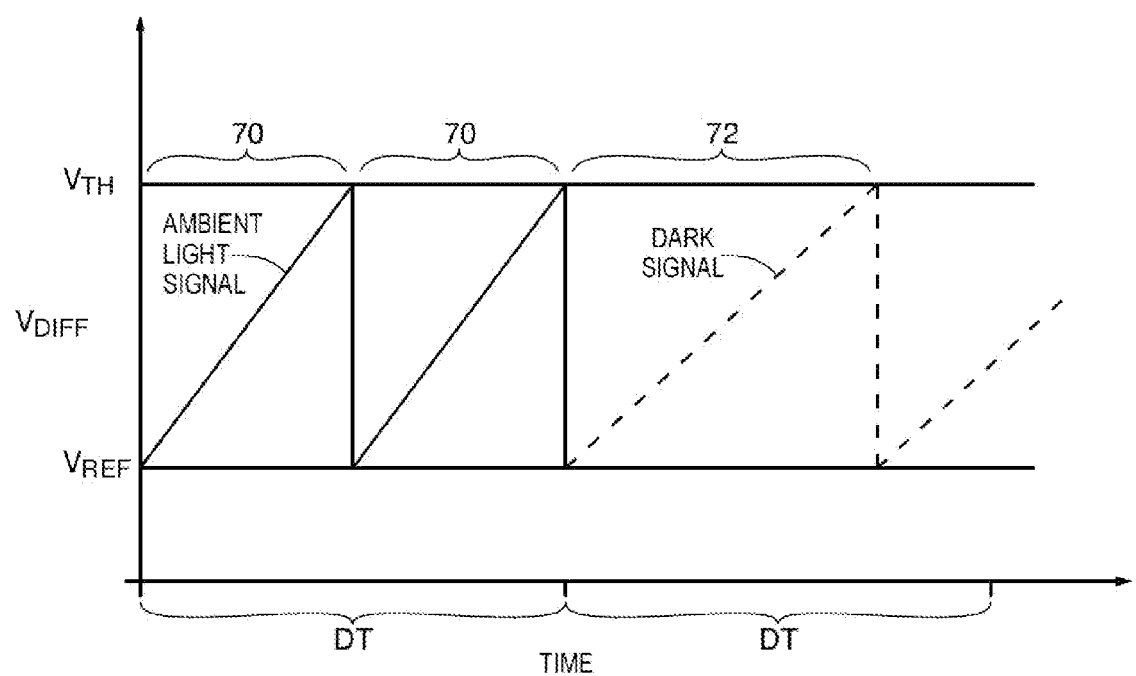
FIG. 6 is an illustrative graph showing how current generated by ambient light and dark current may generate a change in voltage within an ambient light detection circuit in accordance with an embodiment of the present invention.

Counter 50 may be configured to count in a first direction (e.g., increase a counter value by counting up) when multiplexer 46 is providing ambient light signal $V_{RAW}$ from image pixels 190 to integrator 64 and may be configured to count in an opposite direction (e.g., decrease a counter value by counting down) when multiplexer 46 is providing dark signal $V_{DARK}$ from dark pixels 190D to integrator 64. During ambient light detection operations, signal $V_{SIG}$ that is output from multiplexer 46 may be either $V_{RAW}$ or $V_{DARK}$. As shown in FIG. 6, during signal integration, differential signal $V_{DIFF}$ may rise from $V_{REF}$ to threshold voltage $V_{TH}$ after each reset of oscillator 40. Each time $V_{DIFF}$ is substantially equal to $V_{TH}$, switch 58 is may be temporarily closed to reset oscillator 40. $V_{DIFF}$ may rise and fall for one or more cycles 70 while ambient light detection circuitry 52 is coupled to light pixels 190 during a time period DT.

After time period DT, timing and control circuitry 48 may be configured to send a signal to multiplexer 46 to switch ambient light detection circuitry from light image pixels 190 to dark image pixels 190D. Timing and control circuitry 48 may also send a signal changing the capacitance of capacitor 56. $V_{DIFF}$ may rise and fall for one or more dark cycles 72 while ambient light detection circuitry 52 is coupled to dark pixels 190D during an additional time period of common duration DT. After an additional time period DT, timing and control circuitry 48 may be configured to send a signal to multiplexer 46 to switch ambient light detection circuitry from dark image pixels 190D to light image pixels 190 and a signal to capacitor 56 changing the capacitance of capacitor 56 (e.g., back to C from C2). Counter 50 may be configured to count each cycle 70 (e.g., from signal $V_{RAW}$) and to subtract from that count each cycle 72 (e.g., from dark signal $V_{DARK}$). In this way, an ambient light signal having dark signal removed may be determined.

During ambient light detection operations (e.g., when switches 42 are open) timing and control circuitry 48 may operate reset switch 58 (e.g., switch 58 may be temporarily closed so that the reset switch 58 and differential amplifier 60 may act as a voltage follower circuit to cause $V_{SIG}$ to be equal to reference voltage $V_{REF}$ input to the differential amplifier 60). $V_{REF}$ may be less than Vaapix so that arrays 16, during detection of ambient light conditions, use less power than is used to capture images. $V_{REF}$ may be, for example, 1.2 V while Vaapix may be, for example, 2.8 V. $V_{TH}$ may, for example be 1.6V. After the power supply lines to the pixel arrays 16 are (dc) biased to $V_{REF}$, reset switch 58 may be opened to begin the first ambient light detection period.

Pixels 190 that are used to detect the ambient light conditions may then be activated by activating the TX and RST control signals to the transfer transistor 24 and the reset transistor 28 (FIG. 4), respectively, to keep the transistors on or conducting. Rather than being read out by the source follower transistor 34, as it would be during imaging operations, the current collected by the photosensors 22 and floating diffusion regions FD of the pixels 190 may be continuously transferred from the pixels to ambient light detection circuit 52 through the multiplexer 46. The current collected from light pixels 190 minus the current collected from dark pixels 190D (scaled by a scaling factor by variable capacitor 56) corresponds to the average ambient light level falling on the pixels 190 of the pixel arrays 16.

Incoming current from the pixel arrays 16 may be integrated across capacitor 56 of integration circuit 64, causing voltage $V_{SIG}$ (e.g., $V_{RAW}$ or $V_{DARK}$) to rise. Differential amplifier 60 outputs the difference between $V_{SIG}$ and $V_{REF}$ as $V_{DIFF}$. Differential amplifier 60 ensures that the voltage $V_{SIG}$ is close to $V_{REF}$ and the total current from the array is therefore forced onto variable feedback capacitor 56 (charge integrator).

After counting up cycles 70 of $V_{RAW}$ and subtracting cycles 72 of $V_{DARK}$, timing and control circuitry 48 may be configured to reset ambient light detection circuitry 52 by again resetting integrator 64 by closing switch 58, resetting counter 50, sending a signal to multiplexer 46 causing multiplexer 46 to again provide signal $V_{RAW}$ to amplifier 60 and sending a signal switching the capacitance of variable capacitor 56 back to capacitance C. Additional ambient light detection periods may repeat in the same manner as the previous period until image sensors 16 enter an imaging mode of operation.

If desired, all pixels 190 in image sensor array 16 may be used to detect ambient light by activating their respective transfer transistors 24 and reset transistors 28. However, this is merely illustrative. If desired, a selected number of pixels 190 image sensor array 16 may enabled in order to conserve power. Selected pixels 190 may include one or more rows and/or columns of pixels, a sampling of pixels located throughout an image pixel array, a sub-array of contiguous pixels, or a sampling of pixels located throughout multiple image pixel arrays.

If desired, pixels 190 that are used to detect ambient light may be activated by only providing a RST signal to the reset transistor 28 and leaving the transfer transistor 24 off. In this case, ambient light signal will only be produced by the floating diffusion regions FD of the selected pixels. The floating diffusion regions FD may serve as photodetectors in this case. This may allow for smaller photocurrents and may conserve energy. This type of reduced power mode may be beneficial, for example, when the ambient light detection mode is used to maintain a standby mode in an electronic device.

Figure 7:
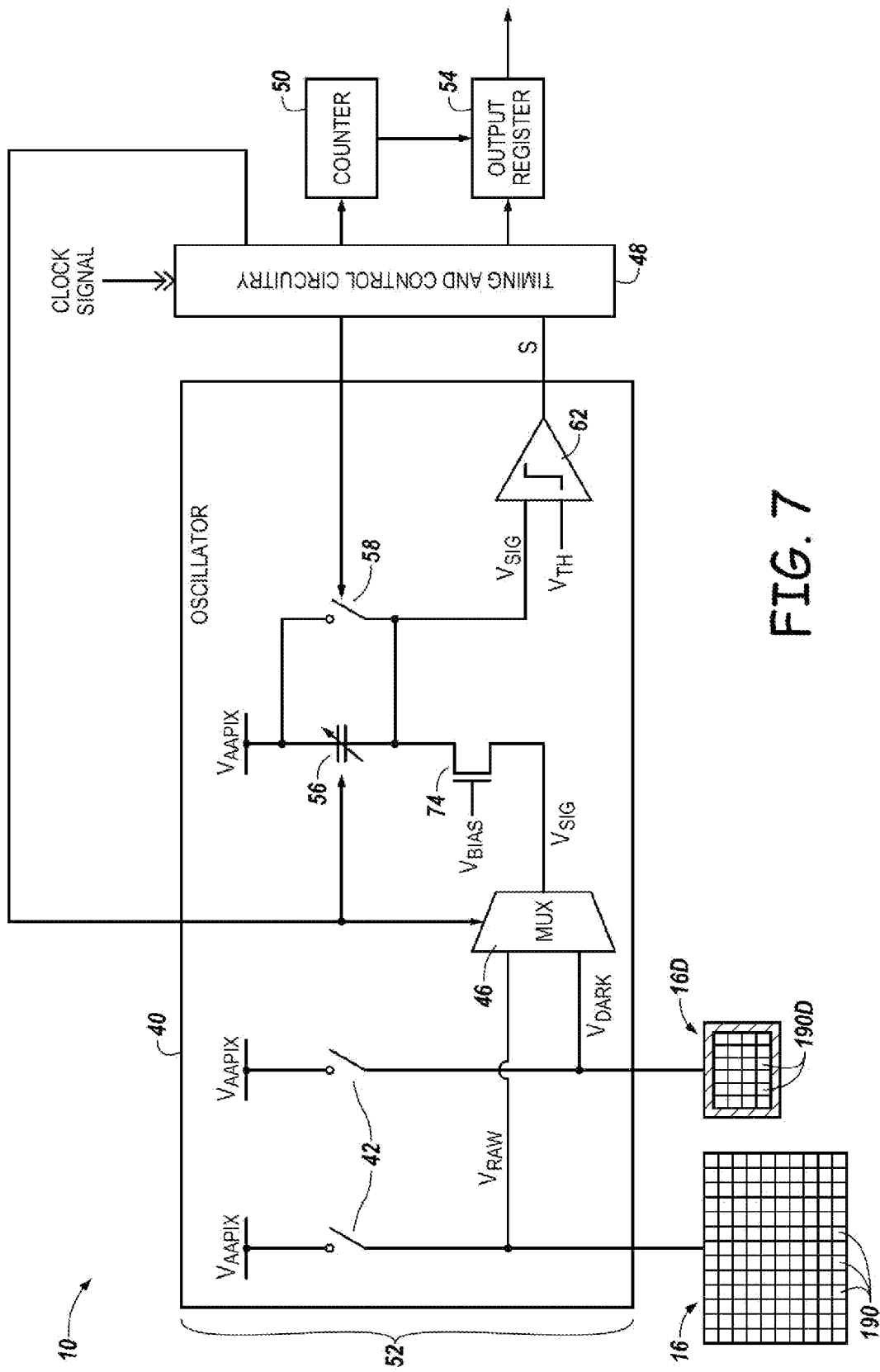
FIG. 7 is a diagram of an illustrative ambient light sensor circuit in accordance with an embodiment of the present invention.

The ambient light detection circuitry of FIG. 5 is merely illustrative. If desired, ambient light detection circuitry may include an oscillator having a variable capacitor coupled to a power supply terminal configured to provide power supply voltage Vaapix as shown in FIG. 7. In the example of FIG. 7, oscillator 40 may include capacitor 56 coupled in series with a bias transistor such as transistor 74 between a voltage supply terminal supplying voltage Vaapix and multiplexer 46. Bias transistor 74 may include a gate terminal that is provided with a bias voltage $V_{BIAS}$. Switch 58 may be configured to supply voltage Vaapix to comparator 62 when closed. When open, current from light image pixels 190 or dark image pixels 190D may drive signal $V_{SIG}$ from Vaapix down toward threshold voltage $V_{TH}$. When signal $V_{SIG}$ (driven by either ambient light or dark current) is substantially equal to threshold voltage $V_{TH}$, comparator 62 may send a signal S to timing and control circuitry 48.

As described above in connection with FIG. 5, upon receiving signal S from oscillator 40, timing and control circuitry 48 may be configured to temporarily close switch 58 and send a count signal to counter 50. In this way, oscillator 40 may be reset and counter 50 may accumulate a count corresponding to the current generated by ambient light incident on image pixels 190.

Counter 50 may be configured to count in a first direction (e.g., up) when multiplexer 46 is providing ambient light signal $V_{RAW}$ from image pixels 190 to bias transistor 74 and may be configured to count in an opposite direction (e.g., down) when multiplexer 46 is providing dark signal $V_{DARK}$ from dark pixels 190D to bias transistor 74.

Figure 8:
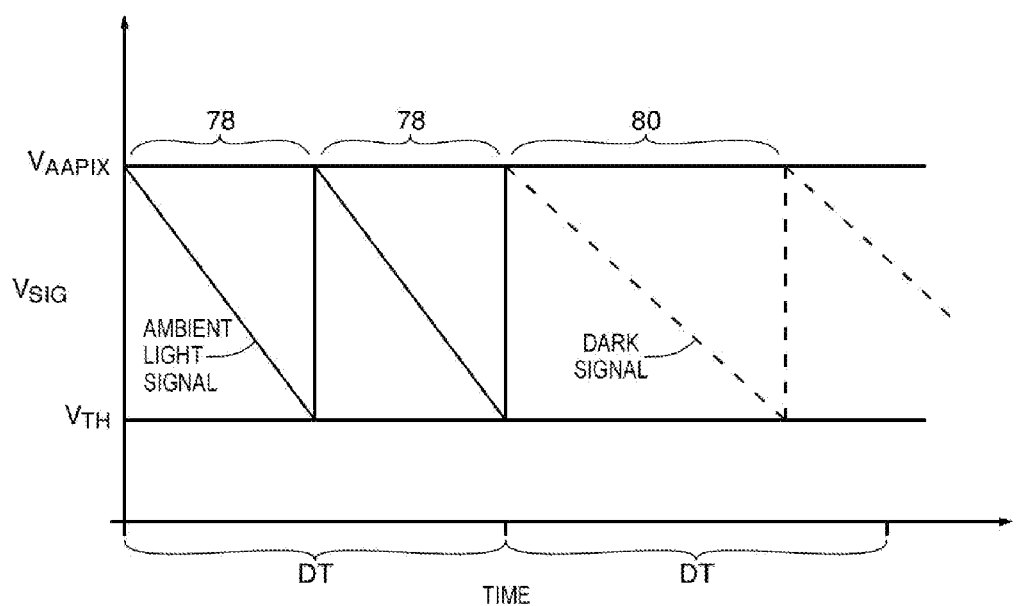
FIG. 8 is an illustrative graph showing how current generated by ambient light and dark current may generate a decrease in voltage within an ambient light detection circuit in accordance with an embodiment of the present invention.

During ambient light detection operations, signal $V_{SIG}$ that is output from multiplexer 46 may be either $V_{RAW}$ or $V_{DARK}$. During signal integration, signal $V_{SIG}$ may fall (due to current from pixels 190 or 190D) from Vaapix to threshold voltage $V_{TH}$ after each reset of oscillator 40 as shown in FIG. 8. Each time $V_{SIG}$ is substantially equal to $V_{TH}$, switch 58 is may be temporarily closed to reset oscillator 40. $V_{SIG}$ may fall and rise for one or more cycles 78 while ambient light detection circuitry 52 is coupled to light pixels 190 during a time period DT.

After time period DT, timing and control circuitry 48 may be configured to send a signal to multiplexer 46 to switch ambient light detection circuitry from light image pixels 190 to dark image pixels 190D. At the same time, timing and control circuitry may send a signal to capacitor 56 switching the capacitance from C to C2 for gain compensation (e.g., to compensate for different numbers ND of dark pixels and NA of light pixels) during dark current integration. $V_{SIG}$ may then fall and rise for one or more dark cycles 80 while ambient light detection circuitry 52 is coupled to dark pixels 190D during an additional time period of common duration DT. After an additional time period DT, timing and control circuitry 48 may be configured to send a signal to multiplexer 46 to switch ambient light detection circuitry from dark image pixels 190D to light image pixels 190. Counter 50 may be configured to count each cycle 78 (e.g., based on signal $V_{RAW}$) and to subtract from that count each cycle 80 (e.g., based on dark signal $V_{DARK}$). In this way, an ambient light signal having dark signal removed may be determined.

Figure 9:
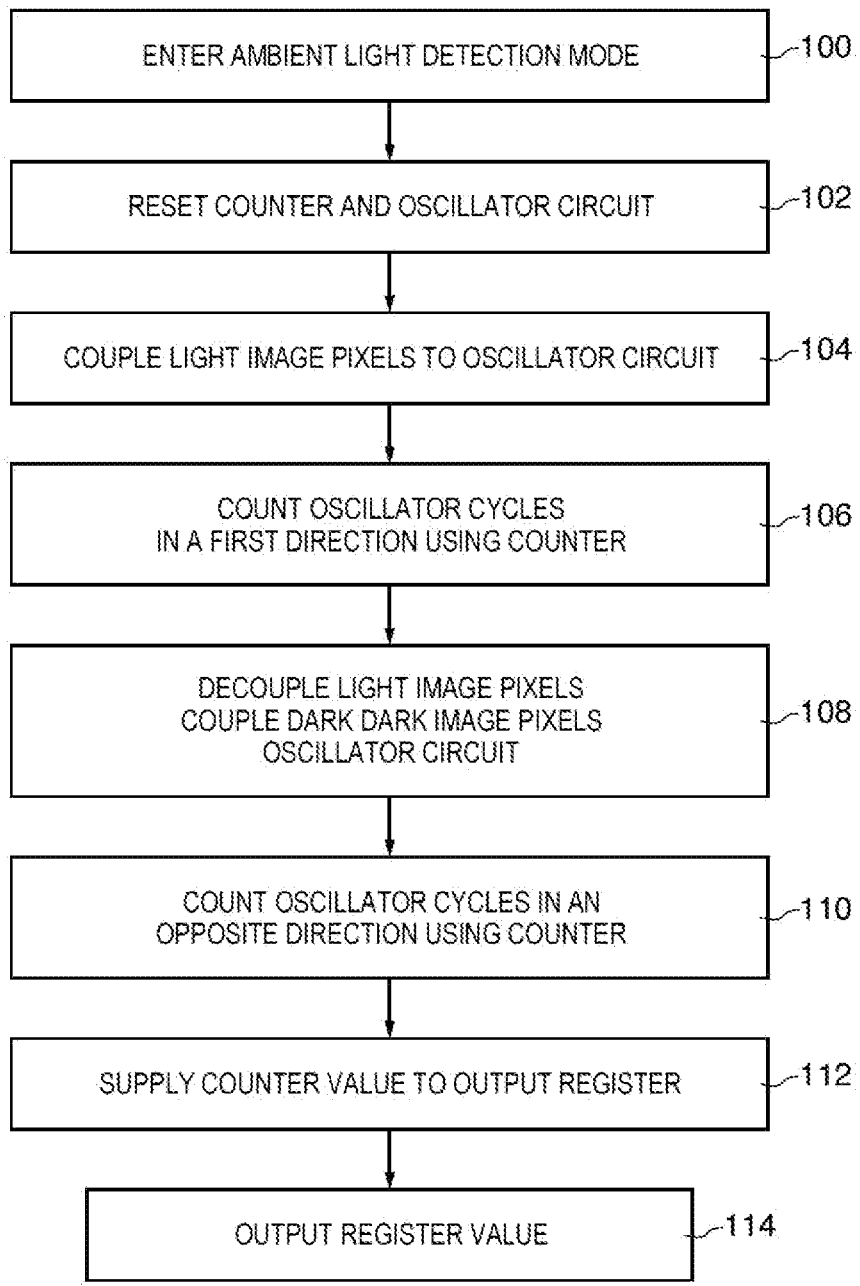
FIG. 9 is a flowchart of illustrative steps that may be used for ambient light detection using an imaging system of the type shown in FIG. 1 in accordance with an embodiment of the present invention.

FIG. 9 is a flowchart showing illustrative steps that may be used in detecting ambient light using an image sensor.

At step 100, one or more image sensors of an image sensor array such as image sensor array 16 (see e.g., FIG. 1) may be switched from an image capture mode to an ambient light detection mode (e.g., ambient light detection circuitry may be coupled to the power supply lines of the image sensor and reset transistor and, if desired, transfer transistor of pixels may be turned on).

At step 102, a counter and oscillator associated with the ambient light detection circuitry may be reset by timing and control circuitry of the ambient light detection circuitry.

At step 104, light image pixels (e.g., image pixels 190) that are configured to receive incoming light may be coupled to the oscillator circuit of the ambient light detection circuitry.

At step 106, the counter may be used to count oscillator cycles of the oscillator circuit corresponding to an amount of current generated in the light image pixels in response to ambient light.

At step 108, the light image pixels may be decoupled from the ambient light detection circuit and dark image pixels (e.g., dark pixels 190D) may be coupled to the ambient light detection circuit (e.g., using a multiplexer such as multiplexer 46 (see, e.g., FIGS. 5 and 7)).

At step 110, the counter may be used to count oscillator cycles of the oscillator circuit corresponding to an amount of current generated in the dark image pixels in response to, for example, heat in a semiconductor substrate of the image sensor. The counter may be configured to count in a direction (e.g., down) that is opposite to the direction of counting at step 106. In this way, the current corresponding to the dark pixels may be subtracted from the current corresponding to the light pixels.

At step 112, the resulting counter value (e.g., the number of cycles counted at step 106 minus the number of cycles counted at step 110) may be provided to an output register.

At step 114, a digital output register value may be provided to circuitry such as processing circuitry 18 (FIG. 1).

Various embodiments have been described illustrating electronic devices having image sensors configured to capture images during image capture operations and to detect ambient light conditions during non-image capture operations. An image sensor may include a plurality of image pixels configured to receive incoming light and a plurality of dark pixels that are optically shielded from incoming light.

An image sensor may include an ambient light detection circuit. The ambient light detection circuit may include an oscillator, timing and control circuitry, counting circuitry (a counter) and an output register circuit. The oscillator may be switchably coupled to the image pixels and the dark pixels. The timing and control circuitry may be configured to operate a multiplexer to switchable couple the oscillator to the image pixels and the dark pixels. The counter may be configured to count up oscillator cycles of the oscillator while the oscillator is coupled to the image pixels and to count down oscillator cycles of the oscillator while the oscillator is coupled to the dark pixels.

The counter may provide a count value that depends on an ambient light signal from image pixels and a dark signal from the dark pixels. The oscillator may include a reset switch operable to reset the oscillator each time an ambient light signal voltage or a dark signal voltage reaches a threshold voltage. The threshold voltage and the signal voltage (e.g., the ambient light signal voltage or the dark signal voltage) may be provided to a comparator. The comparator may provide a saturation signal to the timing and control circuitry. The timing and control circuitry may operate the reset switch each time it receives the saturation signal.

An oscillator circuit may include a capacitor such as a variable capacitor. A capacitor may be coupled in parallel with the reset switch and the comparator or may be coupled between a voltage supply terminal and a bias transistor that is coupled to the multiplexer.

An electronic device may include processing circuitry coupled to the image sensor. The processing circuitry may be configured to process images received from the image sensor during imaging operation and to process ambient light data received from the image sensor during ambient light detection operations. The processing circuitry may be configured to alter the operational state of one or more components of an electronic device in response to the ambient light data. As examples, the processing circuitry may wake the device from a standby or low-power mode, the processing circuitry may increase (or decrease) the intensity of a camera flash, may increase (or decrease) the length of an image exposure, may increase (or decrease) the intensity of a backlight associated with a display or may otherwise operate components of a device in response to ambient light data provided by the image sensor.

The foregoing is merely illustrative of the principles of this invention which can be practiced in other embodiments.

What is claimed is:

1. An image sensor, comprising:
    a plurality image pixels, wherein each image pixel includes a photosensitive element configured to convert incoming light into electric charges;
    a plurality of dark pixels, wherein each dark pixel is optically shielded from the incoming light;
    an oscillator circuit switchably coupled to the plurality of image pixels and the plurality of dark pixels; and
    a counter coupled to the oscillator circuit, wherein the counter is configured to increase a counter value when the oscillator circuit is coupled to the image pixels, and wherein the counter is configured to decrease the counter value when the oscillator circuit is coupled to the dark pixels.

2. The image sensor defined in claim 1, further comprising:
    control circuitry configured to operate the plurality of image pixels to capture image data.

3. The image sensor defined in claim 2, further comprising:
    a multiplexer configured to switchably couple the oscillator circuit to the plurality of image pixels and the plurality of dark pixels, wherein the multiplexer includes a first input terminal coupled to the plurality of image pixels, a second input terminal coupled to the plurality of dark pixels, and an output terminal coupled to the oscillator circuit.

4. The image sensor defined in claim 3 wherein the oscillator circuit comprises:
    a bias transistor having a gate terminal configured to receive a bias voltage;
    a capacitor having a first terminal coupled to the bias transistor;
    a comparator coupled to a second terminal of the capacitor, wherein the second terminal is configured to receive a power supply voltage; and
    a switch interposed between the comparator and the capacitor.

5. The image sensor defined in claim 4 wherein the comparator has a first input terminal coupled to the switch and a second input terminal configured to receive a threshold voltage.

6. The image sensor defined in claim 5, further comprising:
    timing and control circuitry coupled between the counter and the comparator, wherein the timing and control circuitry is configured to operate the capacitor, the multiplexer, and the switch and wherein the timing and control circuitry is configured to provide signals corresponding to oscillator cycles of the oscillator circuit to the counter.

7. The image sensor defined in claim 6, further comprising:
    an output register circuit configured to receive the counter value from the counter and to provide an output register value to external circuitry, wherein the counter value is indicative of ambient light intensity.

8. The image sensor defined in claim 4 wherein the capacitor comprises a variable capacitor.

9. An electronic device, comprising:
    an image sensor having image pixels, at least one dark pixel and ambient light detection circuitry; and
    processing circuitry coupled to the image sensor, wherein each image pixel and the at least one dark pixel include a photosensitive element coupled to a storage node by a transfer transistor, wherein the ambient light detection circuitry includes a multiplexer having a first input terminal coupled to the image pixels and a second input terminal coupled to the at least one dark pixel, and wherein the processing circuitry is configured to receive image data and ambient light data from the image sensor.

10. The electronic device defined in claim 9 further comprising:
    a first switch coupled to the first terminal and the image pixels; and
    a second switch coupled to the second terminal and the at least one dark pixel, wherein the first and second switches each have an open and a closed configuration, wherein the processing circuitry is configured to receive the image data when the first and second switch are each in their respective closed configuration and wherein the processing circuitry is configured to receive the ambient light data when the first and second switch are each in their respective open configuration.

11. The electronic device defined in claim 10 wherein the ambient light detection circuitry further comprises:
    a comparator having a first terminal configured to receive a threshold voltage; and
    an integration circuit coupled between the multiplexer and a second terminal of the comparator.

12. The electronic device defined in claim 11 wherein the integration circuit comprises a differential amplifier and wherein the comparator is configured to receive a differential signal from the differential amplifier that is based on a reference voltage and a signal voltage.

13. The electronic device defined in claim 12 wherein the integration circuit further comprises a capacitor coupled in parallel with the differential amplifier.

14. The electronic device defined in claim 13 wherein the integration circuit further comprises a switch coupled in parallel with the capacitor and the differential amplifier.

15. The electronic device defined in claim 14 further comprising:
   timing and control circuitry configured to receive output signals from the comparator; and
   circuitry configured to receive signals from the timing and control circuitry that are based on the output signals from the comparator, wherein a portion of the output signals from the comparator correspond to ambient light that is incident on the image pixels and wherein an additional portion of the output signals from the comparator correspond to dark current that is generated in the at least one dark pixel.

16. The electronic device defined in claim 15 further comprising:
   an output register circuit configured to receive a counter value from the circuitry and to provide the ambient light data to the processing circuitry, wherein the counter value is based on the signals from the timing and control circuitry, and wherein the ambient light data is based on the counter value.

17. A method of operating an image sensor having an array of image pixels, a plurality of dark pixels and an ambient light detection circuit switchably coupled to the array of image pixels and the dark pixels, comprising:
   coupling the array of image pixels to the ambient light detection circuit;
   with the ambient light detection circuit, while the array of image pixels is coupled to the ambient light detection circuit, generating an ambient light signal;
   coupling the dark pixels to the ambient light detection circuit;
   with the ambient light detection circuit, while the dark pixels are coupled to the ambient light detection circuit, generating a dark signal; and
   subtracting the dark signal from the ambient light signal.

18. The method defined in claim 17 wherein the ambient light detection circuit comprises a multiplexer and wherein coupling the array of image pixels to the ambient light detection circuit comprises coupling the array of image pixels to the ambient light detection circuit using the multiplexer.

19. The method defined in claim 17 wherein the ambient light detection circuit comprises an oscillator and a counting circuit, wherein generating the ambient light signal comprises counting up oscillator cycles of the oscillator with the counting circuit while the array of image pixels is coupled to the ambient light detection circuit, and wherein generating the dark signal and subtracting the dark signal from the ambient light signal comprises counting down oscillator cycles of the oscillator with the counting circuit while the dark pixels are coupled to the ambient light detection circuit.

20. The method defined in claim 17, further comprising:
   decoupling the array of image pixels from the ambient light detection circuit;
   providing the array of image pixels with a power supply voltage; and
   with the array of image pixels, capturing image data.

* * * * *